United States Patent
Cases et al.

(10) Patent No.: US 8,102,042 B2
(45) Date of Patent: Jan. 24, 2012

(54) REDUCING PLATING STUB REFLECTIONS IN A CHIP PACKAGE USING RESISTIVE COUPLING

(75) Inventors: Moises Cases, Austin, TX (US); Bhyrav M. Mutnury, Austin, TX (US); Nanju Na, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 12/630,720

(22) Filed: Dec. 3, 2009

(65) Prior Publication Data

US 2011/0133326 A1 Jun. 9, 2011

(51) Int. Cl.
*H01L 23/498* (2006.01)
(52) U.S. Cl. .. 257/690; 257/678; 257/734; 257/E23.062
(58) Field of Classification Search .................. 257/690, 257/678, 737–738, 734, 780, 777, E23.062
See application file for complete search history.

(56) References Cited

U.S. PATENT DOCUMENTS

| | | | |
|---|---|---|---|
| 5,847,936 A * | 12/1998 | Forehand et al. | 361/794 |
| 6,284,982 B1 | 9/2001 | Kusner et al. | |
| 6,812,690 B2 * | 11/2004 | De Jong et al. | 324/756.02 |
| 7,349,224 B2 | 3/2008 | Ohsaka | |
| 2002/0180015 A1 * | 12/2002 | Yamaguchi et al. | 257/678 |
| 2003/0150840 A1 | 8/2003 | Lillie et al. | |
| 2003/0171011 A1 * | 9/2003 | Li | 439/68 |
| 2003/0174092 A1 | 9/2003 | Sullivan et al. | |
| 2004/0018658 A1 * | 1/2004 | Mano | 438/106 |
| 2004/0104464 A1 | 6/2004 | Kuzawinski et al. | |
| 2004/0253825 A1 | 12/2004 | Kawabata | |
| 2005/0230823 A1 | 10/2005 | Ohsaka | |
| 2006/0192282 A1 | 8/2006 | Suwa et al. | |
| 2007/0152771 A1 | 7/2007 | Shan et al. | |

OTHER PUBLICATIONS

Wang, Jiangtao et al. "Thin Film Embedded Resistors", Gould Electronics Inc. Eastlake, Ohio, pp. 1-6.
Felten, John et al. "Embedded Ceramic Resistors and Capacitors in PWB: Process and Performance", 5 pages.
International Business Machines Corporation—PCT/EP2010/066487, "PCT—International Search Report and Written Opinion", Jan. 19, 2011, 9 pages.

* cited by examiner

*Primary Examiner* — Thanh Nguyen
(74) *Attorney, Agent, or Firm* — Thomas Tyson; Jeffrey L. Streets

(57) ABSTRACT

Improving signal quality in a high-frequency chip package by resistively connecting an open-ended plating stub to ground. One embodiment provides a multi-layer substrate for interfacing a chip with a printed circuit board. A conductive first layer provides a chip mounting location. A signal interconnect is spaced from the chip mounting location, and a signal trace extends from near the chip mounting location to the signal interconnect. A chip mounted at the chip mounting location may be connected to the signal trace by wirebonding. A plating stub extends from the signal interconnect, such as to a periphery of the substrate. A resistor is used to resistively couple the plating stub to a ground layer.

14 Claims, 4 Drawing Sheets

REDUCING PLATING STUB REFLECTIONS IN A CHIP PACKAGE USING RESISTIVE COUPLING

BACKGROUND OF THE INVENTION

1. Field of the Invention

The present invention relates to signal quality in chip packages, and more specifically to reducing plating stubs reflections and resonance in high-frequency chip packages.

2. Background of the Related Art

An integrated circuit (IC), also commonly referred to as a "microchip" or "chip," is an electronic circuit comprising miniaturized semiconductor devices formed in a semiconductor substrate. Many copies of a chip may be formed on a large semiconductor wafer and then cut into individual chips, which may be interchangeably referred to in the art as "die chips" or "dies". However, semiconductor materials such as silicon are typically brittle, and chips made this way are fragile. Therefore, an individual die chip is commonly packaged on a carrier, referred to as a "chip package" or simply "package." The chip package protects the chip and provides an electrical and mechanical interface between the chip and a printed circuit board (PCB) such as a computer motherboard.

Electrical connections between a die chip and the package substrate may be made by wirebonding. Wirebonding is a process known in the art by which a very fine wire is connected from a bond pad on the chip to corresponding signal pathways ("traces") on a package substrate. Bond wires are typically formed of a highly conductive material, such as platinum, copper, aluminum alloys, doped gold, or other precious metal. A package in which a die chip is connected to the substrate by wirebonding may be referred to as a "wirebond package." The traces on the substrate extend from the location of bonding with the wirebond to signal interconnects elsewhere on the substrate.

The signal interconnects on one layer of the substrate may be electrically connected to signal interconnects on another layer of the substrate using plated through-hole connections known as "vias." Thus, for example, the signal interconnects on the face to which the chip is mounted may provide a connection between a first face of the substrate and corresponding pins of a pin grid array (PGA) or to corresponding balls of a ball grid array (BGA) on the opposing face of the substrate. The PGA or BGA may then be placed in contact with a corresponding pattern of electrical contacts on the PCB, such as a motherboard, to which the chip package is subsequently secured.

Signal traces are typically formed of commonly available materials, such as copper, that are relatively affordable and have sufficient electrical conductivity. Materials having improved electrical conductivity, including precious metals such as platinum and gold, may then be selectively applied to the substrate at locations where the expense of such materials is warranted. For example, platinum may be applied at locations along the signal traces where bond wires are to be connected. Gold is often used in the formation of signal interconnects.

These electrically conductive materials are usually applied by electroplating. In the electroplating process, a voltage is applied at or near the periphery of the package substrate, which results in open plating stubs extending from the signal interconnects to or near the periphery of the substrate. Plating stubs may hinder signal performance of the package if left intact due to reflections in the open stubs at the high operational frequencies of modern chips. A quarter-wave length resonance is particularly detrimental in high speed data transmissions.

BRIEF SUMMARY OF THE INVENTION

A first example embodiment of the present invention provides a multi-layer substrate for interfacing a chip with a printed circuit board. The multi-layer substrate includes a substrate having a first face with a central mounting location for receiving the chip. An electronically conductive material is disposed on the first face of the substrate. The electronically conductive material forms a signal interconnect spaced from the chip mounting location, a signal trace extending to the signal interconnect, and a plating stub extending from the signal interconnect toward a periphery of the substrate. An electronically conductive ground layer is parallel to the first face and is separated from the first face by an electronically nonconductive layer. A resistor couples the plating stub to the ground layer.

A second example embodiment of the invention provides a chip package. The chip package includes a multi-layer substrate having a first face, an opposing second face, and a ground layer. An integrated circuit chip is secured to the first face of the substrate and includes a plurality of bond pads. A signal trace extends along the first face from the bond pads to a signal interconnect that is spaced from the chip along the first face of the substrate. The chip is placed in electronic communication with the signal trace and signal interconnect by connecting one end of a bond wire to one of the bond pads on the chip and connecting another end of the bond wire to the signal trace. A plating stub, which extends from the signal interconnect toward a periphery of the multi-layer substrate, is connected to the ground layer with a resistor. Optionally, an electrical contact is disposed along the first or second face of the substrate and is in electronic communication with the signal trace, wherein the electrical contact is configured for electrically contacting a corresponding electrical contact on a printed circuit board.

A third example embodiment of the invention provides a method, including steps of forming a signal trace in a signal layer of a multi-layer package substrate, forming an open ended plating stub as a result of forming the signal trace, and resistively coupling the open ended plating stub to a ground layer in the multi-layer package substrate.

DETAILED DESCRIPTION OF THE INVENTION

One embodiment of the invention is a method of reducing the resonant frequency in a high-frequency chip package by terminating an open-ended plating stub with a resistor. The plating stub may be resistively coupled to ground using a thin film resistor or a discrete, surface mount (SMT) resistor. Another embodiment of the invention is a multi-layered package substrate in a high-frequency chip package, wherein an open-ended plating stub is resistively coupled to ground. Resistively coupling a plating stub to ground according to the invention provides an effective way to reduce the effects of plating stub reflections, and is more economical than other approaches to mitigating the effects of plating stubs. The invention may be applied in its various embodiments to a multitude of chip package configurations known in the art. Principles of the invention discussed in relation to the illustrated embodiments, therefore, may also be applied to configurations of a chip package other than the illustrated chip package.

Figure 1:
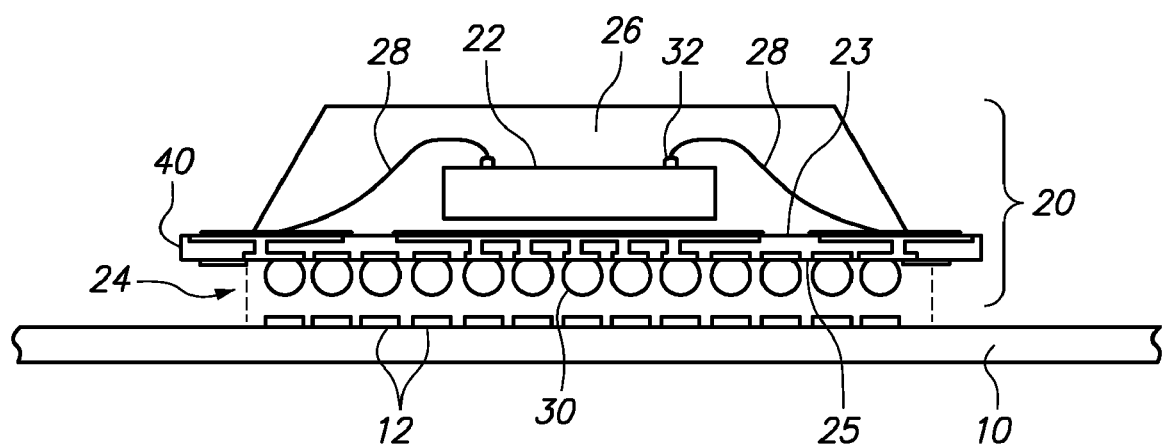
FIG. 1 is a schematic side view of a surface-mount, semiconductor chip package configured for assembly to a surface of a printed circuit board.

FIG. 1 is a schematic side view of a surface-mount, semiconductor chip package 20 that may be selectively coupled to a surface of a printed circuit board (PCB) 10. For simplicity of illustration, the package substrate 40 shows only two layers, but will typically include more than two layers. The package 20 includes a chip 22 secured relative to a first face 23 of the package substrate 40. Although not required, the chip 22 may be enclosed in a protective housing 26, such as molded plastic encapsulating the chip 22. The chip 22 is electrically connected to the package substrate 40 using bond wires 28 (only two of many are shown). The bond wires 28 may be connected at one end to bond pads 32 on the chip 22 and at the other end to traces on the package substrate 40. The chip 22 is electrically coupled through the package substrate 40 to a ball grid array (BGA) 24 disposed on a second face 25 of the package substrate 40 opposite the first face 23. In the orientation shown, the first face 23 may be referred to as the top face and the second face 25 may be referred to as the bottom face. The array of balls 30 are aligned for contact with a corresponding pattern of electrical contacts or pads 12 on the PCB 10. The balls 30 may be heated to melting or softening while in contact with the electrical pads 12 on the PCB 10, and then cooled to secure the BGA. As an alternative, pins or other electrical contacts may be provided on the package substrate 40 in lieu of a ball grid array, with an appropriate choice of electrical contacts on the PCB 10 for mating with the pins or other electrical contacts on the package substrate 40.

Figure 2:
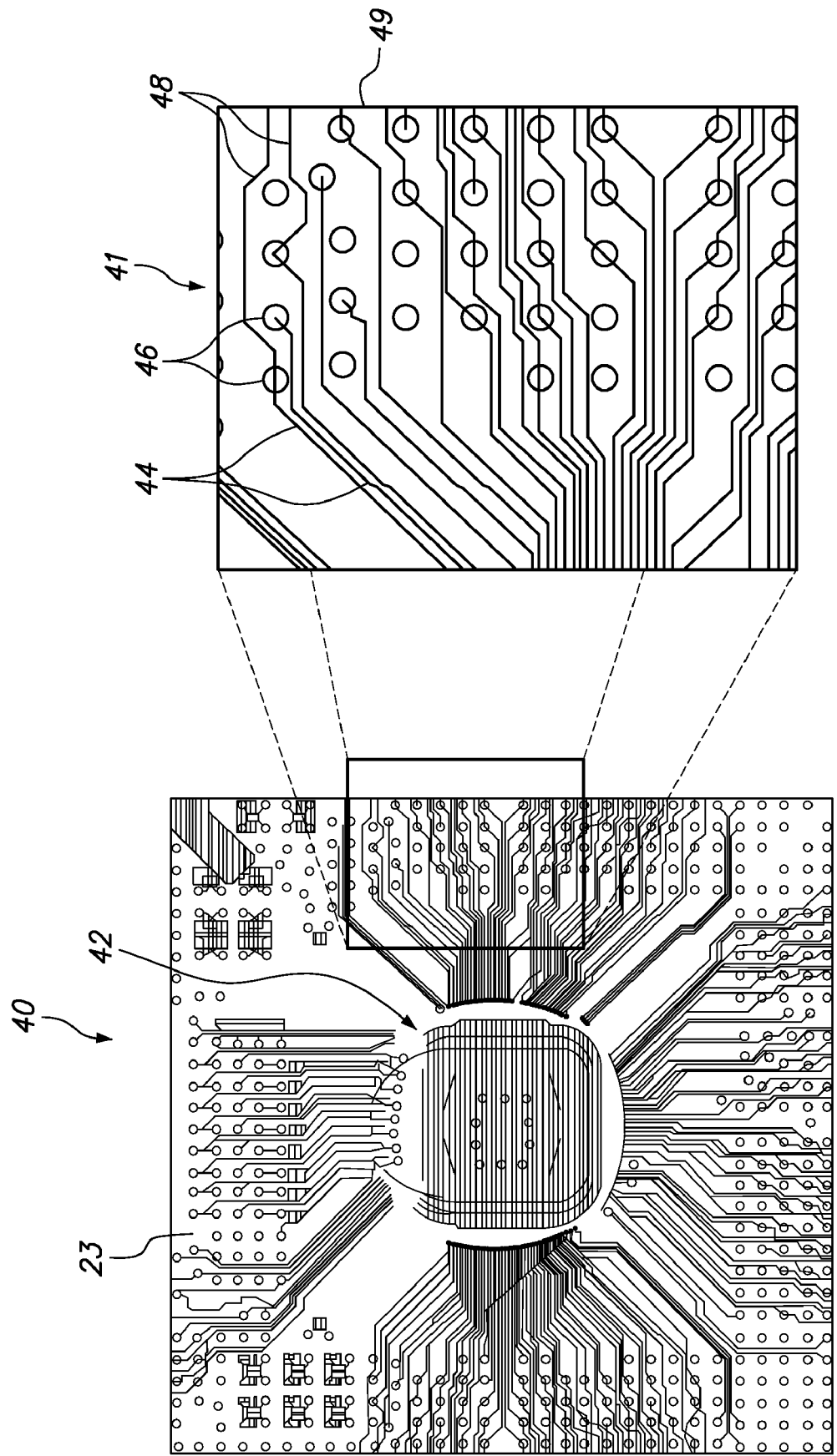
FIG. 2 is a plan view of the package substrate of FIG. 1, including an enlarged view of a portion of the substrate showing the open-ended plating stubs.

FIG. 2 is a plan view of the package substrate 40 without the chip 22, housing 26 or bond wires 28 (See FIG. 1). A portion 41 of the package substrate 40 is shown enlarged. The package substrate 40 provides a centrally located chip mounting location 42 for receiving the chip 22. A plurality of discrete electrical pathways, embodied here as signal traces 44, is formed on the package substrate 40. The signal traces 44 may be formed according to known techniques in the art of circuit board manufacturing. The signal traces 44 may be formed, for example, by a subtractive process, in which a sheet of copper or other conductive material laminated or electroplated to the package substrate 40 is etched away to leave the desired pattern of traces. Less commonly, the signal traces 44 may be formed by an additive process, in which copper is plated onto the package substrate 40 in the desired pattern such that no etching is required. A plurality of signal interconnects 46 is shown positioned along the top face 23 of the package substrate 40. The signal interconnects 46 are concentric with signal vias, which are plated through-holes extending through the package substrate 40 from one layer to another layer. Each signal trace 44 extends radially outwardly from near the chip mounting location 42 to a corresponding one of the signal interconnects 46.

Figure 3:
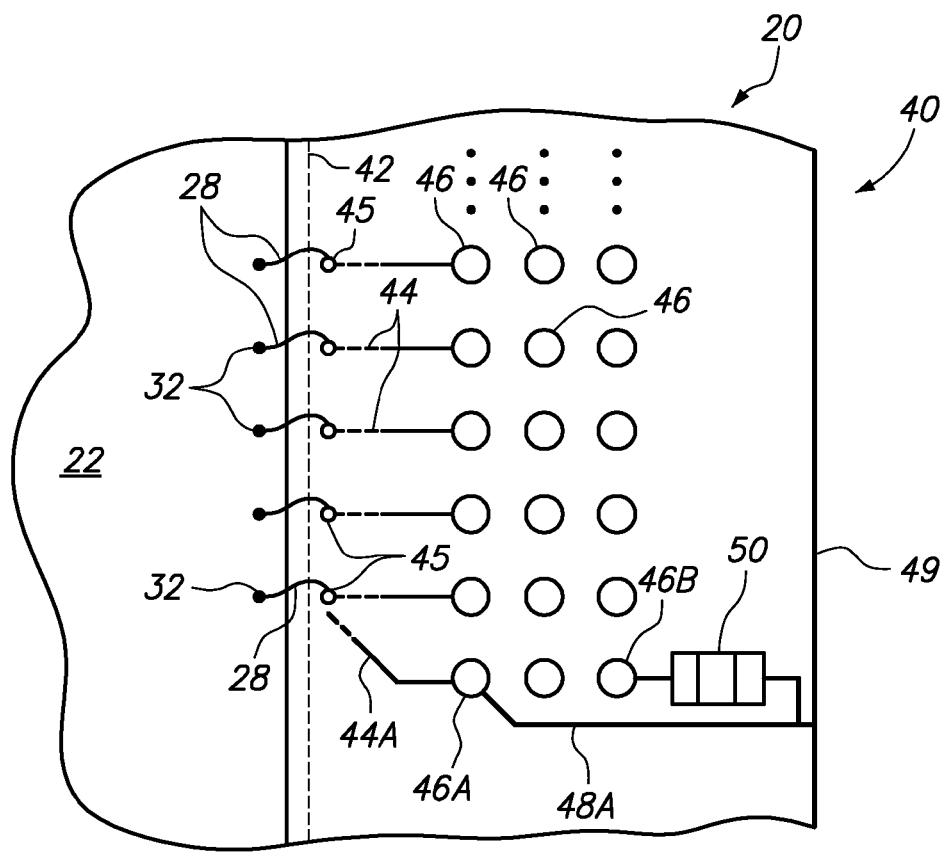
FIG. 3 is a schematic plan view of the package substrate of FIG. 1 wherein a resistive element is connected between one of the plating stubs and ground in order to reduce resonance.

Features of the package substrate 40 may be electroplated, such as the signal interconnects 46, the signal vias concentric with the signal interconnects 46, and bonding locations on the signal traces 44 where bond wires are to be attached (see FIG. 3). As best shown in the enlarged portion 41, a plurality of open-ended plating stubs 48 extend outwardly from many of the signal interconnects 46 in a direction away from the chip mounting location 42 to a periphery 49 of the package substrate 40. The plating stubs for other signal interconnects are routed on the opposite side of the package substrate 40 from BGA pads to the periphery 49. The signal traces 44 and the plating stubs 48 extend outwardly from the centrally located chip mounting location 42 to the periphery 49 of the package substrate 40.

Typically, the open plating stubs 48 extend all the way from one of the signal interconnects 46 to the periphery 49 of the package substrate 40, because to perform gold plating for electrode pads on the package substrate 40, the electrode pads must be rendered conductive from the outer edge of the substrate. The plating stubs 48 are open ended because ends of the plating stubs 48 extend from the respective signal interconnects 46 to the periphery 49 without electrically connecting to another device or conductive pathway.

FIG. 3 is a schematic plan view of a portion of the chip package 20 wherein a selected plating stub 48A is resistively coupled to ground. The chip 22 is electrically connected to the package substrate 40 using bond wires 28. The bond wires 28 are each connected at one end to a respective bond pad 32 on the chip 22 and at the other end to a bonding location 45 on a respective signal trace 44. By way of example, a particular bond pad 32 on the chip 22 is electrically connected to a signal trace 44A using a bond wire 28. The signal trace 44A extends outwardly from the bonding location 45 near the chip mounting location 42 to a signal interconnect 46A. An open-ended plating stub 48A extends outwardly from the signal interconnect 46A to the periphery 49 of the package substrate 40. A resistor 50 is coupled at one end to the selected plating stub 48A and at the other end to a ground via 46B on the package substrate 40. The ground via 46B is in electrical communication with a ground layer in the multi-layer package substrate 40. The resistor 50 may take the form of a discrete, surface-mount resistor (i.e. a resistor mounted to a surface of the package substrate 40). Alternatively, the resistor 50 may be an embedded resistor, examples of which are discussed in relation to FIGS. 5, 6, and 7.

Figure 4:
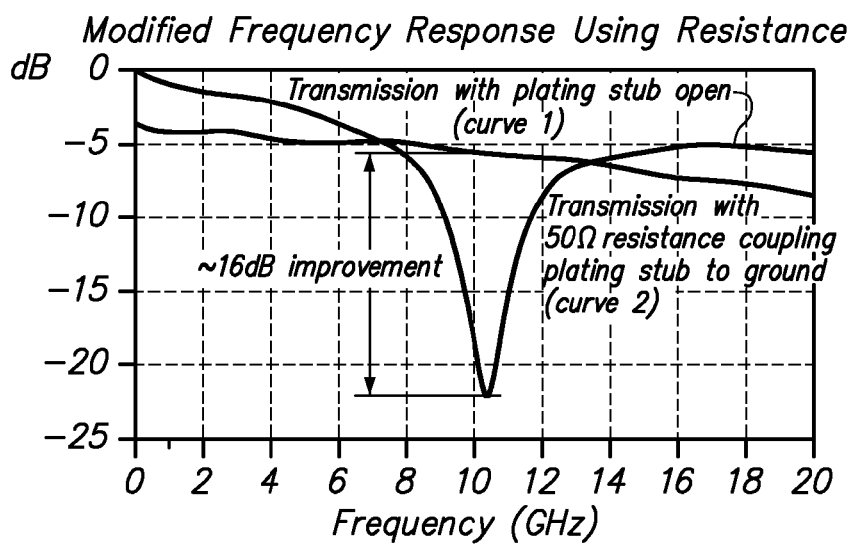
FIG. 4 is a graph illustrating the improvement in signal quality that results from connecting the resistive element between a plating stub and ground.

FIG. 4 is a graph comparing the resonant frequency response of an open-ended plating stub versus the frequency response of the plating stub terminated with a resistive element coupled to ground. Curve 1 illustrates the signal performance for signals communicated along the signal trace 44A in FIG. 3, where the signal trace is in electronic communication with an open plating stub 48A (i.e., without resistive element 50) having a stub length of 5 mm. The peak of Curve 1 indicates a resonant frequency occurring at about 10.3 GHz, whereas current high speed signals operate in an overlapping range from 5 Gbps to 13.5 Gbps. The 10.3 GHz resonant frequency caused by the presence of the plating stub 48A imposes substantial signal interference, and is detrimental to high-speed signal transmission along the signal trace 44A. Curve 2 illustrates the improved signal performance for signals communicated along the signal trace 44A in FIG. 3, with 50 Ohms of resistance coupling the plating stub to ground. Approximately 16 dB of improvement in signal quality results from providing the resistive coupling, which greatly reduces the interference that would otherwise be caused by an open plating stub. This improvement in signal quality allows signals to be driven over longer distance, allows low cost and cheap materials to be used in the printed circuit board, allows signal lines to be spaced more closely together, enables fewer routing layers to be used.

Figure 5:
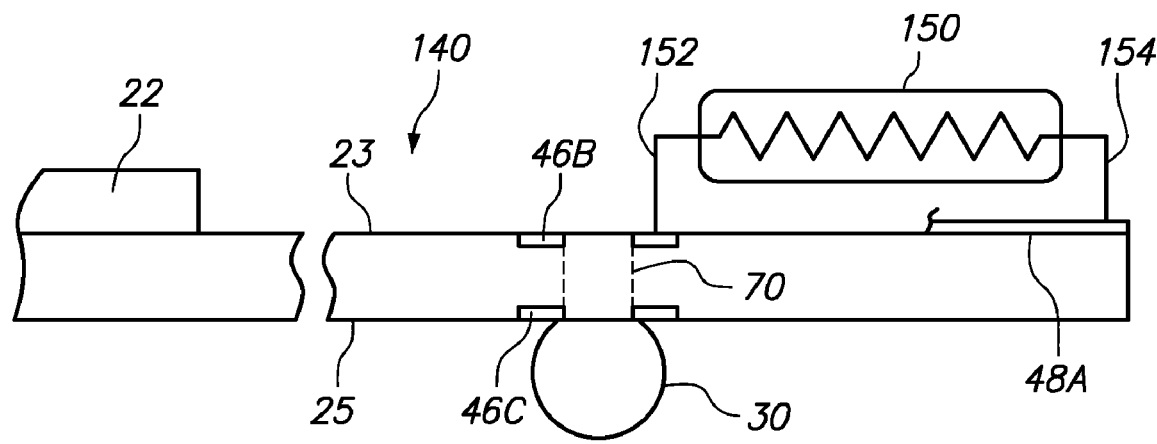
FIG. 5 is a cross-sectional side view of an embodiment of a package substrate incorporating a discrete resistor for connecting the plating stub to ground.
Figure 6:
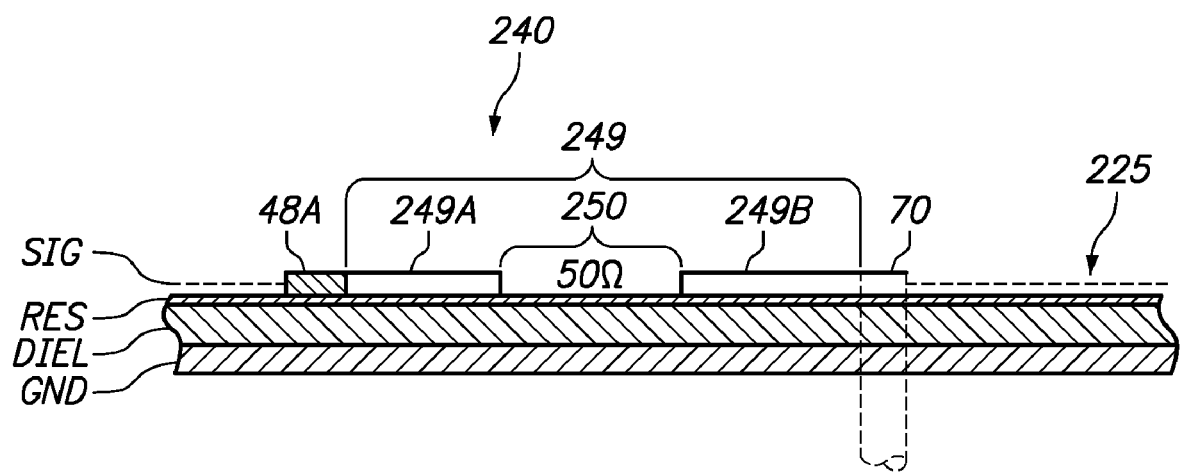
FIG. 6 is a cross-sectional view of a multi-layered package substrate wherein the plating stub is resistively grounded using an embedded resistor.

A myriad of possible layering configurations in a package substrate are possible. Additionally, a variety of resistor types may be selected according to different embodiments of the invention. Accordingly, a substrate incorporating resistance between a plating stub and ground, as schematically shown in FIG. 3, may be embodied in many different ways, examples of which are shown in FIGS. 5-7. In the examples that follow, FIG. 5 shows an embodiment of a substrate using a discrete, surface-mount resistor, while FIG. 6 shows alternative embodiments of a substrate using an embedded resistor.

FIG. 5 is a cross-sectional side view of an embodiment of a package substrate 140 incorporating a discrete resistor 150 for connecting the plating stub 48A to ground. The resistor 150 includes a first lead 154 connected to the plating stub 48A and a second lead 152 connected to the ground signal interconnect 46B according to an embodiment of the invention. The ground signal interconnect 46B on the top face 23 of the substrate 140 is connected through the substrate 140 by a via 70 to a ground signal interconnect 46C on the opposing, bottom face 25 of the substrate 140. A conductive ball 30 from the ball grid array is in contact with the ground signal interconnect 46C. When the substrate 140 is connected to a PCB, the ground signal interconnect 46C may be placed in contact with a ground terminal on the PCB, so that the resistor 150 is connected between the plating stub 48A and ground. The use of a discrete resistor, such as in FIG. 5, can be a relatively low cost solution for improving signal quality according to an aspect of the invention.

FIG. 6 is a cross-sectional view of a multi-layered package substrate 240 wherein the plating stub 48A is resistively grounded using an embedded resistor 250. The multi-layered package substrate 240 may have any number of layers, including a signal layer (SIG), a resistive layer (RES), a dielectric layer (DIEL), and a ground layer (GND). The GND, RES, and SIG layers may be formed by electrodepositing, as generally understood in the art of PCB manufacturing apart from the present invention. For example, the resistive layer may be formed by sputter depositing a nickel-chromium alloy or other resistive material on the dielectric layer. The signal layer may be formed by sputter-depositing copper on the resistive layer.

The plating stub 48A is shown in cross-section (oriented out of the page). A grounding trace 249 extends along a face 225 of the substrate 240 from the plating stub 48A to a ground via 70. The ground via 70 is also connected to the ground layer. The plating stub 48A and the grounding trace 249 may be formed by selectively etching the signal layer. The resistor 250 may be formed by etching the signal layer to remove a portion of the grounding trace 249, such that the grounding trace 249 is separated into a first portion 249A and a second portion 249B electrically connected along an exposed portion of the resistive layer. This creates an electrical pathway to the ground via 70 through the resistive layer, from the first portion 249A to the second portion 249B of the grounding trace 249. The length of the resistor 250 (and the corresponding amount of the grounding trace 249 to be removed by etching) may be selected according to the resistivity of the SIG layer on a per-unit-length basis, to achieve the desired resistance value of the resistor 250. A value of 50 ohms was achieved here, by way of example. The use of an embedded resistor instead of a discrete resistor as described herein avoids the potential addition of a noise component that can be caused by the presence of resistor leads when using a discrete resistor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A multi-layer substrate for interfacing a chip with a printed circuit board, comprising:
    a substrate having a first face with a central mounting location for receiving the chip;
    an electronically conductive material disposed on the first face of the substrate, the electronically conductive material forming a signal interconnect spaced from the chip mounting location, a signal trace extending to the signal interconnect, and a plating stub extending from the signal interconnect toward a periphery of the substrate;
    an electronically conductive ground layer that is parallel to the first face and separated from the first face by an electronically nonconductive layer; and
    a resistor coupling the plating stub to the ground layer.

2. The multi-layer substrate of claim 1, wherein the resistor comprises a discrete resistor secured to the first face of the substrate, the discrete resistor including a first lead electrically connected to the plating stub and a second lead electrically connected to a ground via, the ground via being electrically connected to the ground layer.

3. The multi-layer substrate of claim 1, wherein the resistor is embedded within the multi-layer substrate.

4. The multi-layer substrate of claim 1, further comprising:
    a resistive layer deposited on the first layer; and
    a grounding trace extending from the plating stub to a ground via in the first layer, the ground via being electrically connected to the ground layer, the grounding trace including separated first and second portions to define an electrical pathway through the resistive layer between the first portion of the grounding trace and the second portion of the grounding trace.

5. The multi-layer substrate of claim 4, wherein the resistive layer comprises a nickel-chromium alloy.

6. The multi-layer substrate of claim 1, wherein the resistor couples the plating stub to the ground layer through a signal via that is concentric with and in electrical communication with the signal interconnect.

7. The multi-layer substrate of claim 6, further comprising:
a ball grid array disposed on a second face of the substrate, the ball grid array including a conductive ball connected with the signal via.

8. A chip package, comprising:
a multi-layer substrate having a first face, an opposing second face, and a ground layer;
a chip secured to the first face of the substrate, the chip including a plurality of bond pads;
a signal interconnect spaced from the chip along the first face of the substrate;
a signal trace extending along the first face to the signal interconnect;
a bond wire connected at one end to one of the bond pads on the chip and connected at another end to the signal trace;
a plating stub extending from the signal interconnect toward a periphery of the multi-layer substrate;
a resistor connecting the plating stub to the ground layer; and
an electrical contact disposed along the first or second face of the substrate and in electronic communication with the signal trace, the electrical contact configured for electrically contacting a corresponding electrical contact on a printed circuit board.

9. The chip package of claim 8, wherein the electrical contact disposed along the first or second face of the substrate comprises a ball of a ball grid array.

10. The chip package of claim 8, further comprising:
a bond wire electrically connecting the chip to the signal trace.

11. The chip package of claim 8, wherein the resistor comprises a discrete resistor secured to the first face, the discrete resistor including a first lead electrically connected to the plating stub and a second lead electrically connected to a ground layer in the multi-layer substrate.

12. The chip package of claim 8, wherein the resistor is embedded within the multi-layer substrate.

13. The chip package of claim 12, further comprising:
a resistive layer;
a ground via extending through the multi-layer substrate to the ground via;
a grounding trace extending from the plating stub to the ground via, wherein the resistor includes a portion of the resistive layer bridging separated first and second portions of the grounding trace.

14. The chip package of claim 13, wherein the resistive layer comprises a nickel-chromium alloy.

* * * * *